US008618808B2

(12) United States Patent
Ohya (10) Patent No.: US 8,618,808 B2
(45) Date of Patent: Dec. 31, 2013

(54) FIELD DEVICE

(75) Inventor: Kentaro Ohya, Tokyo (JP)

(73) Assignee: Azbil Corporation, Tokyo (JP)

( * ) Notice: Subject to any disclaimer, the term of this patent is extended or adjusted under 35 U.S.C. 154(b) by 625 days.

(21) Appl. No.: 12/989,852

(22) PCT Filed: Apr. 20, 2009

(86) PCT No.: PCT/JP2009/057846
§ 371 (c)(1),
(2), (4) Date: Oct. 27, 2010

(87) PCT Pub. No.: WO2009/133782
PCT Pub. Date: Nov. 5, 2009

(65) Prior Publication Data
US 2011/0037478 A1    Feb. 17, 2011

(30) Foreign Application Priority Data
Apr. 28, 2008   (JP) .................................. 2008-116870

(51) Int. Cl.
G01R 31/00   (2006.01)
G01R 31/14   (2006.01)
G01R 31/08   (2006.01)
(52) U.S. Cl.
USPC ........................ 324/500; 324/509; 324/512
(58) Field of Classification Search
None
See application file for complete search history.

(56) References Cited

U.S. PATENT DOCUMENTS

2012/0249231 A1 * 10/2012 Okuda et al. .............. 327/594
2013/0073166 A1 *  3/2013 Sollart ....................... 701/84

FOREIGN PATENT DOCUMENTS

| JP | 6-60287 A | 3/1994 |
| JP | 6-25073 Y2 | 6/1994 |
| JP | 8-247881 A | 9/1996 |
| JP | 2006-323661 A | 11/2006 |

OTHER PUBLICATIONS

"THZ2 & TDZ2 HLPRG Progammable Smart HART Signal Isolator", Nov. 30, 2007, XP55042776, Retrieved from the Internet: URL: http://www.miinet.com/custservice/manuals/thz2_tdz2hlprg_man.pdf [retrieved on Oct. 31, 2012].
European Search Report, dated Nov. 7, 2012, which issued during the prosecution of European Patent Application No. 09738719.5.

* cited by examiner

Primary Examiner — Jermele M Hollington
(74) Attorney, Agent, or Firm — Troutman Sanders LLP (57) ABSTRACT

Disclosed is a field device which determines whether or not an abnormality which was detected is the type of abnormality which may not allow the output of a burn-out H signal, and sets a signal output for the abnormality to a burn-out L signal when the type of abnormality was one which may not allow the output of a burn-out H signal. For example, an abnormality in the D/A converter or the power supply. Therefore, a burn-out L signal is always output for an abnormality judged likely not to be able to output a burn-out H signal, and the certainty of reporting an abnormality when burn-out H is set is enhanced.

4 Claims, 9 Drawing Sheets

Background Art

FIG. 12

Background Art

FIG. 13

Background Art

FIG. 14

Background Art

FIELD DEVICE

CROSS REFERENCE TO PRIOR APPLICATIONS

This application is a U.S. National Phase application under 35 U.S.C. §371 of International Application No. PCT/JP2009/057846, filed on Apr. 20, 2009 and claims benefit of priority to Japanese Patent Application No. 2008-116870, filed on Apr. 28, 2008. The International Application was published in Japanese on Nov. 5, 2009 as WO 2009/133782 under PCT Article 21(2). All of these applications are herein incorporated by reference.

FIELD OF TECHNOLOGY

The present invention relates to a field device for regulating, in response to a measured value, the value of an electric current that flows through a two-wire transmission circuit, with a specific electric current range (for example, between 4 and 20 mA) as a normal regulating range.

BACKGROUND OF THE INVENTION

Conventionally there have been field devices that use two-wire transmission circuits, such as differential pressure/pressure transmitters, electromagnetic flow meters, positioners, and the like, that use CPUs and that have, in addition to the actual measurement functions and control functions of the devices, fault diagnosing functions for diagnosing faults that occur within the devices themselves.

For example, a differential pressure/pressure transmitter includes a sensor portion for receiving a pressure and/or differential pressure and generating an analog signal in accordance with the magnitude thereof; an A/D converting device for converting into a digital signal the analog signal received from the sensor portion; a CPU for sampling the digital signal outputted from the A/D converting device, to calculate a measured value for the pressure/differential pressure; a D/A converting device for converting the digital measured value, calculated by the CPU, into a corresponding analog signal within a specific electric current range (between 4 and 20 mA); a transmitting portion for outputting to the two-wire transmission circuit the analog signal outputted from the D/A converting device; a power supply portion for generating an operating power supply for the various portions within the device itself, based on an electric current between 4 and 20 mA received from the two-wire transmission circuit; and the like.

This differential pressure/pressure transmitter is provided with a function for detecting various types of faults that occur within the device itself, where the fault detection is performed through the CPU that is equipped within the device and/or through a fault diagnosing circuit. When a fault is detected by this function, the CPU outputs, to the two-wire transmission circuit, a burnout signal that is a signal of a level that is different from the electric current range (the normal regulating range) of between 4 and 20 mA when outputting the measured value. Doing so provides notification, to a higher-level device (a monitoring device), which monitors the electric current flowing in the two-wire transmission circuit, that a fault has occurred within the device.

Note that the burnout signal may be a burnout H signal of a level that is higher than an upper limit value for the normal regulating range, or a burnout L signal of a level that is lower than a lower limit value for the normal regulating range, and each device is selectively set in advance to use one of these burnout signals as the signal to be outputted to the transmission circuit when a fault has been detected. (See, for example, Reference 1 (Japanese Examined Utility Model Registration Application Publication H6-25073) and Reference 2 (Japanese Unexamined Patent Application Publication H8-247881)).

Figure 11:
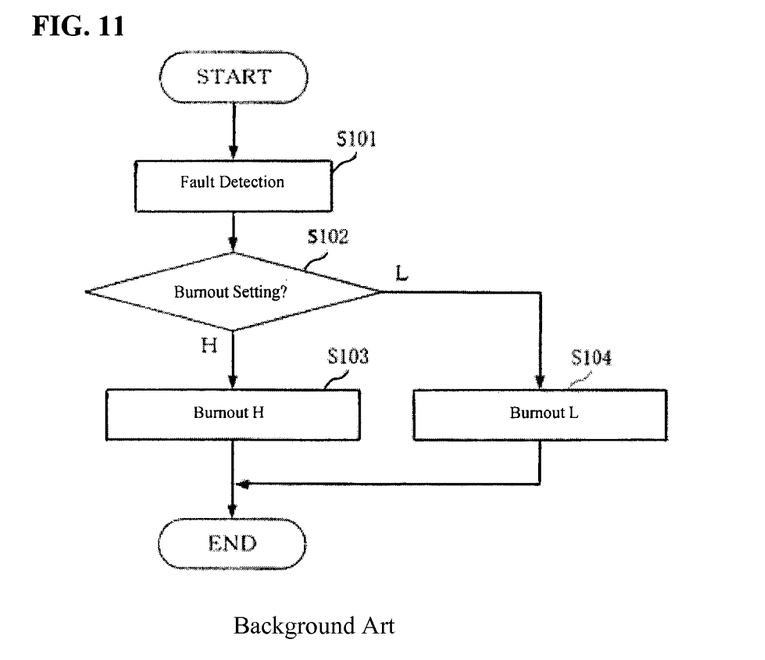
FIG. 11 is a flowchart illustrating a typical process operation when outputting the burnout signal in a conventional field device.

FIG. 11 presents a flowchart of typical process operations when outputting a burnout signal. At this time, when a fault that has occurred within the device is detected (Step S101), the CPU checks whether the burnout H signal has been set as the burnout signal, or whether the burnout L signal has been set as the burnout signal (Step S102).

The burnout signal is set, for example, using DIP switches at the stage of factory shipment. Note that the selection set up may also be performed the operation of DIP switches, or the like, on-site.

Figure 12:
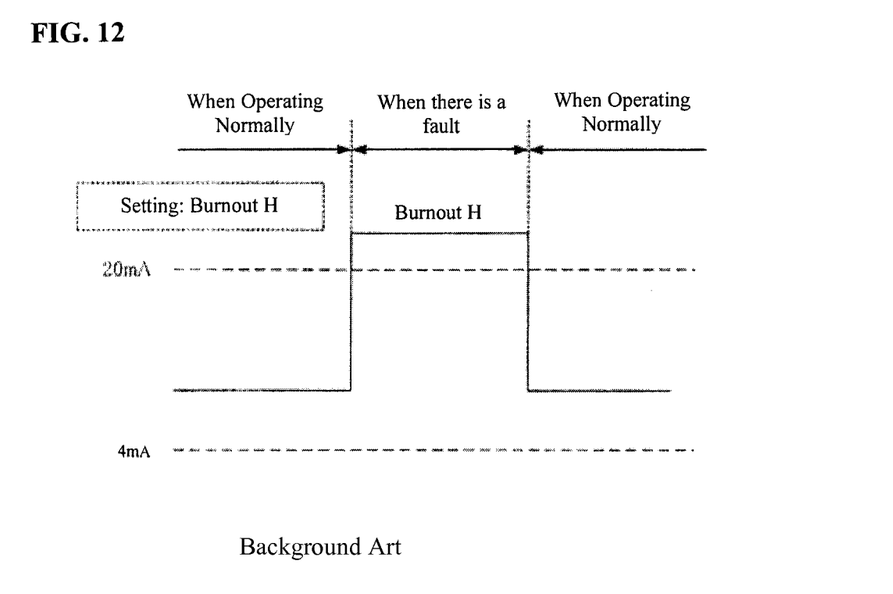
FIG. 12 is a timing chart illustrating the state of the burnout signal output when burnout H is set in a typical process operation.
Figure 13:
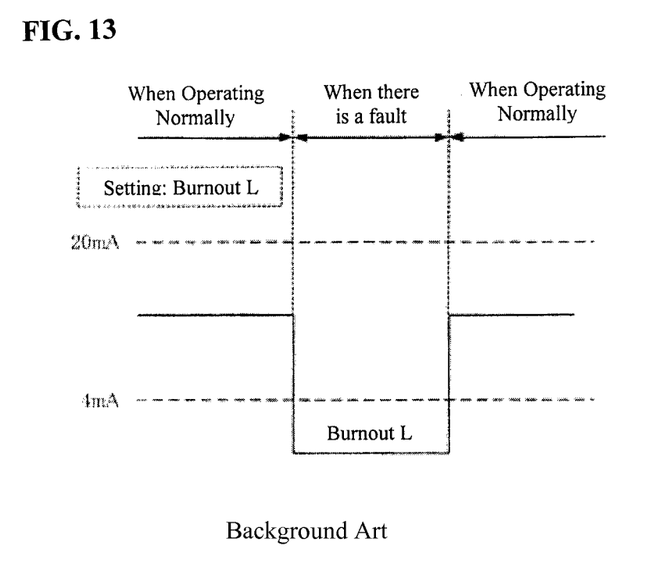
FIG. 13 is a timing chart illustrating the state of the burnout signal output when burnout L is set in a typical process operation.

If the burnout H signal has been set, then here the burnout H signal that has been set is outputted to the transmission circuit (Step S103 (referencing FIG. 12)). If the burnout L signal has been set, then that burnout L signal that has been set is outputted to the transmission circuit (Step S104 (referencing FIG. 13)).

However, in the field device wherein this type of operation is performed, when a fault occurs within the device itself, it may not be possible to produce an output in excess of 20 mA, due to the fault that has occurred. For example, if the fault has occurred within the D/A converting device or within the power supply portion, then it may not be possible to produce an output in excess of 20 mA to the transmission circuit.

Figure 14:
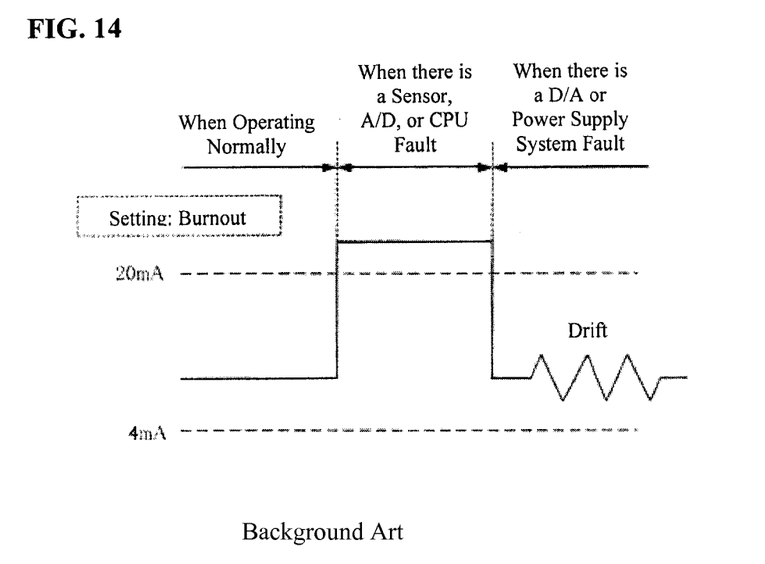
FIG. 14 is a timing chart illustrating for explaining the problem when burnout H is set in a conventional field device.

That is, if the burnout H signal has been set as the signal to be outputted to the transmission circuit when a fault is detected, then even if there is a fault in the D/A converting device or in the power supply portion, the value of the electric current that flows in the transmission circuit may drift within the normal regulating range of between 4 and 20 mA, without the ability to output the burnout H signal of greater than 20 mA (referencing FIG. 14). Because of this, there has been a problem in that cases have occurred wherein it has not been possible to provide notification, to the higher-level monitoring device, of a fault that has occurred within the device, so that it has not been possible to perform the fault notification reliably.

The present invention is to solve this type of problem area, and the object thereof is to provide a field device with increased reliability of fault notification.

SUMMARY OF THE INVENTION

In order to achieve the object set forth above, the present invention comprises: electric current regulating means for regulating the value of an electric current that flows in a two-wire transmission circuit in accordance with a measured value, with a specific electric current range as a normal regulating range; fault detecting means for detecting various types of faults that occur within the device itself; burnout direction setting means able to set whether to output to the transmission circuit a first burnout signal (burnout H signal) of a level higher than an upper limit value of the normal regulating level or to output to the transmission circuit a second burnout signal (burnout L signal) that is less than a lower limit value for the normal regulating range, when a fault has been detected by the fault detecting means; and burnout direction changing means for evaluating whether or not it is possible to output the burnout H signal in relation to a fault that has been detected by the fault detecting means, and for causing the signal that is outputted in response to the fault to be the burnout L signal if it is determined that it is not possible to output the burnout H signal.

In the present invention, whether or not it is possible to output the burnout H signal in relation to a fault that has been detected, and if it is determined that it is not possible to output the burnout H signal, then the signal that is outputted for the fault is defined as the burnout L signal. Doing so causes the burnout L signal to be outputted reliably for a fault wherein it has been determined that the burnout H signal cannot be outputted, thus increasing the reliability of the fault notification when burnout H has been set.

In the present invention, a determination is made as to whether or not it is possible to output the burnout H signal in response to the detected fault, and if it is determined that the burnout H signal cannot be outputted, then the burnout L signal used as the signal that is outputted in response to the fault, and thus the burnout L signal is outputted for a fault wherein it is determined that it is not possible to output the burnout H signal, thereby making it possible to increase the reliability of the fault notification when burnout H is set.

DETAILED DESCRIPTION OF THE INVENTION

The present invention will be explained in detail based on the drawings.

Figure 1:
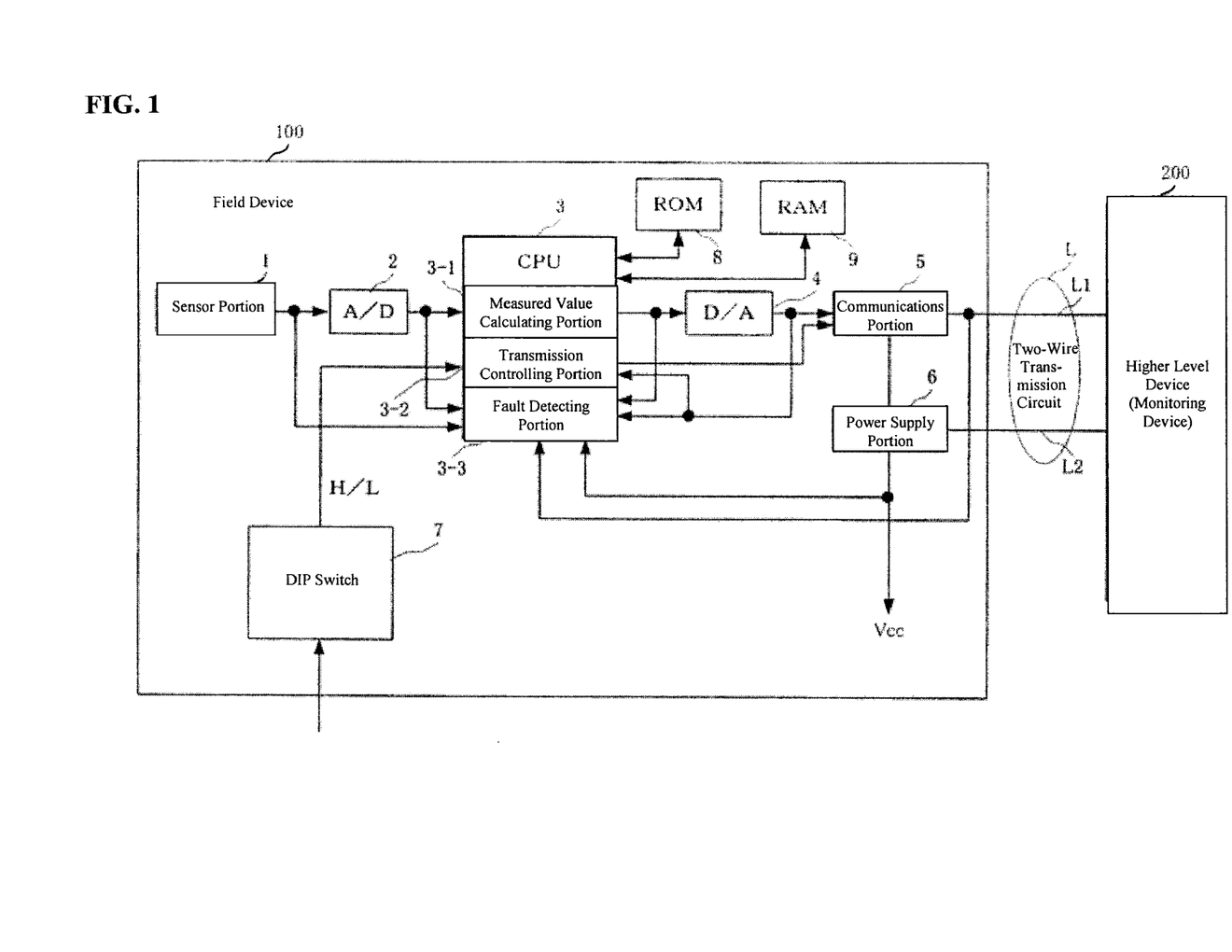
FIG. 1 is a block diagram illustrating schematically one example of a field device according to the present invention.

FIG. 1 is a block diagram illustrating schematically an example of a field device according to the present invention.

In this figure: 100 is a field device according to the present invention, and 200 is a higher-level device (monitoring device) connected through a two-wire transmission circuit L (L1 and L2) to the field device 100. In this example, the field device 100 is a differential pressure/pressure transmitter.

The field device 100 has a sensor portion 1 for receiving a pressure and/or differential pressure and for producing an analog signal in accordance with the magnitude thereof; an A/D converting device for converting into a digital signal the analog signal from the sensor portion 1; a CPU 3 for sampling the digital signal outputted from the A/D converting device 2 to calculate a measured value for the pressure/differential pressure; a D/A converting device 4 for converting the digital measured value calculated by the CPU 3 into a corresponding analog signal of a specific electric current range (between 4 and 20 mA); a communications portion 5 for outputting, to the two-wire transmission circuit, the analog signal outputted by the D/A converting device 4; a power supply portion 4 for generating the operating power supply Vcc for the various portions within the device itself, based on an electric current of between 4 and 20 mA obtained from the two-wire transmission circuit L; a DIP switch 7 able to selectively set the signal that is outputted to the transmission circuit L at the time of fault detection to use either the burnout H signal or the burnout L signal; a ROM 8; and a RAM 9.

In this field device 100, the CPU 3 operates in accordance with a program stored in the ROM 8 while accessing the RAM 9. In addition to a measured value processing program for calculating a measured value for the pressure/differential pressure by sampling the digital signal from the A/D converting device 2, and for providing notification to the monitoring device 200, a fault diagnosing program, which is a program that is unique to the present example of embodiment, for detecting various types of faults that occur within the device itself and for providing verification to the monitoring device 200, is stored in the ROM 8.

Note that while in the FIG. 1, a measured value calculating portion 3-1, a transmission controlling portion 3-2, and a fault detecting portion 3-3 are illustrated as functional blocks in the CPU 3, the measured value calculating portion 3-1, the transmission controlling portion 3-2, and the fault detecting portion 3-3 are achieved as processing functions by the CPU 3 following a program.

In the functional blocks in this CPU 3, the measured value calculating portion 3-1 calculates a measured value for the pressure/differential pressure by sampling the digital signal from the A/D converting device 2, and outputs the measured value as a digital measured value to the D/A converting device 4.

The fault detecting portion 3-3 monitors the outputs of the sensor portion 1, the A/D converting device 2, the CPU 3, the D/A converting device 4, the communications portion 5, and the power supply portion 6, to detect, as various types of faults that occur within the device itself, faults in these various portions. Note that when it comes to the CPU 3, faults within the CPU 3 itself are diagnosed through monitoring the output from the measured value calculating portion 3-1. This fault detecting portion 3-3 corresponds to the fault detecting means in the invention as set forth in claim 1.

The transmission controlling portion 3-2 inputs, from the DIP switch 7, the selection setting state for the burnout signal, determines, in accordance with the selection setting state for the burnout signal from the DIP switch 7, whether the signal to be outputted to the transmission circuit L when a fault is detected by the fault detecting portion 3-3 is to be the burnout H signal or the burnout L signal, and provides an instruction to the communications portion 5. Furthermore, when determining the burnout signal, a determination is made by the fault detecting portion 3-3 as to whether or not it is possible to output the burnout H signal in response to the fault that has been detected, and if it is determined that is not possible to output the burnout H signal, then the signal to be outputted to the transmission circuit L in response to that fault uses the burnout L signal. The transmission controlling portion 3-2 corresponds to the burnout direction changing means in the invention as set forth, and the DIP switch 7 corresponds to the burnout direction setting means in the invention as set forth.

Figure 2:
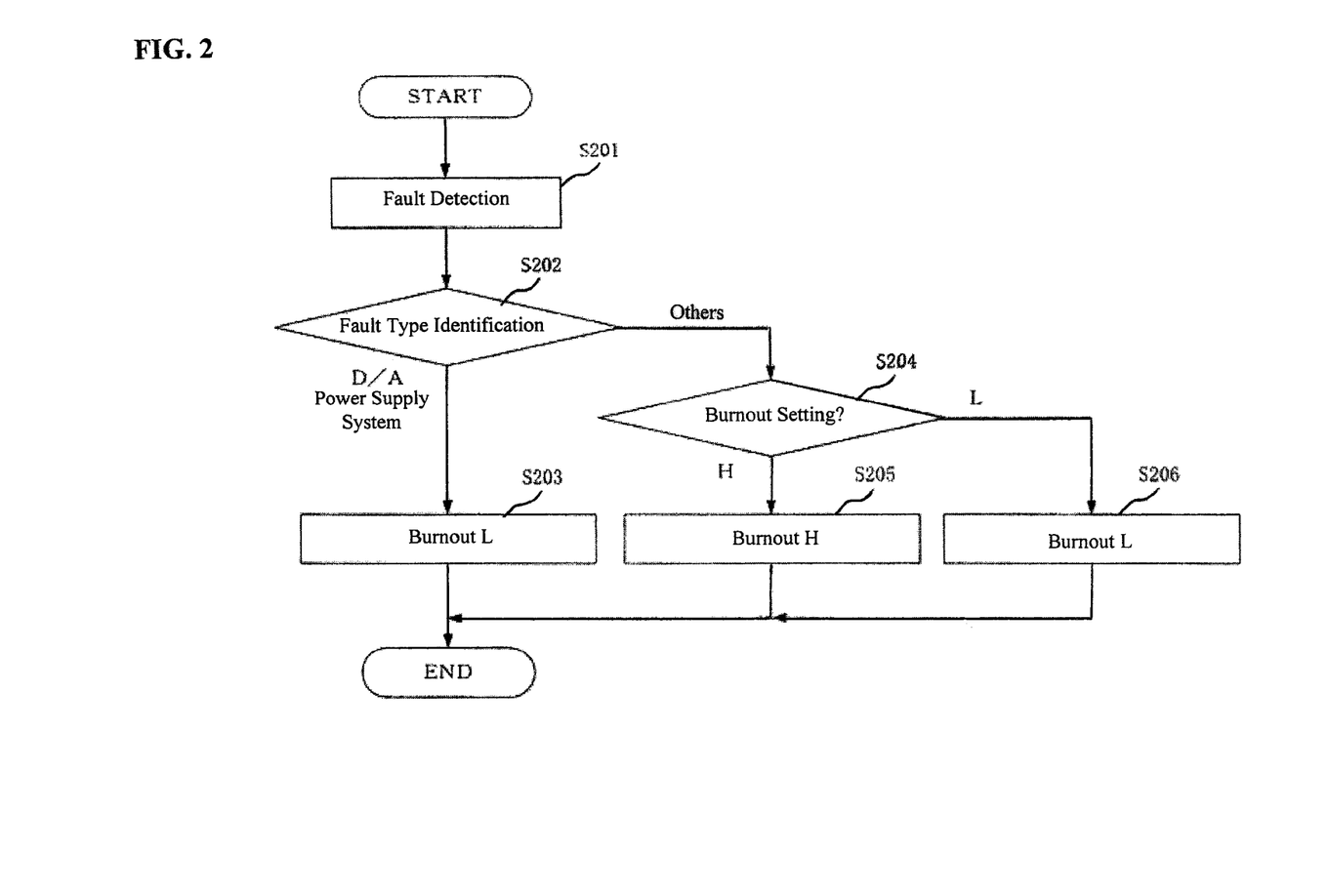
FIG. 2 is a flowchart illustrating an example of a process operation of a transmission controlling portion in the field device.

Example of a Process Operation: Example of Setting the Burnout L Signal when it is Determined that there is a High Probability that the Burnout H Signal Cannot be Outputted FIG. 2 illustrates a first example of a process operation that is executed in the transmission controlling portion 3-2. In this first example of a process operation, when a fault has been detected by the fault detecting portion 3-3 (Step S201), the transmission controlling portion 3-2 identifies the type of the fault (Step S202). The identification of the type of the fault in this Step S202 corresponds to the fault type identifying means in the invention.

If the fault identification is that of a fault in the D/A converting device 4 and/or the power supply portion 6, then it is determined that there is a high probability that it is not possible to output the burnout H signal, and the signal to be outputted to the transmission circuit in response to that fault uses the burnout L signal (Step S203). The processing function to use the burnout L signal in Step S203 corresponds to the burnout signal changing means in the invention as set forth.

If, in Step S202, the type of fault is not a fault in the D/A converting device 4 and/or the power supply portion 6, then the transmission controlling portion 3-2 determines that there is a high probability that it is possible to output the burnout H signal, and the burnout signal is outputted in accordance with the selection setting state of the burnout signal from the DIP switch 7 (Step S204).

If, in this case, the burnout H signal is set, then the burnout H signal is used as the signal to be outputted to the transmission circuit L (Step S205), and if the burnout L signal is set, then the burnout L signal is used as the signal to be outputted to the transmission circuit L (Step S206).

Figure 3:
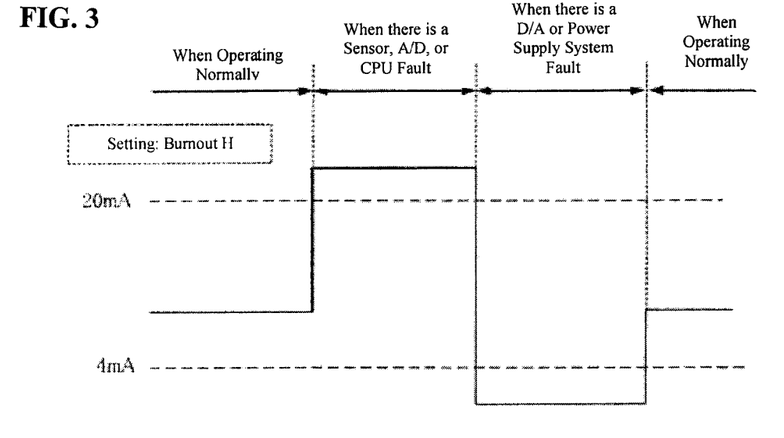
FIG. 3 is a timing chart illustrating the state of the burnout signal output when burnout H is set in the example of the process operation.

A timing chart for the output state of the burnout signal when burnout H is set in the first example of the process operation is illustrated in FIG. 3. As can be understood from this timing chart, when there is a fault in the D/A converting device 4 and/or in the power supply portion 6 in the first example of the process operation, or in other words, when a fault has occurred wherein it is determined that there is a high probability that it will not be possible to output the burnout H signal, then the burnout L signal will be outputted reliably, increasing the reliability of the fault notification when burnout H is set.

Figure 4:
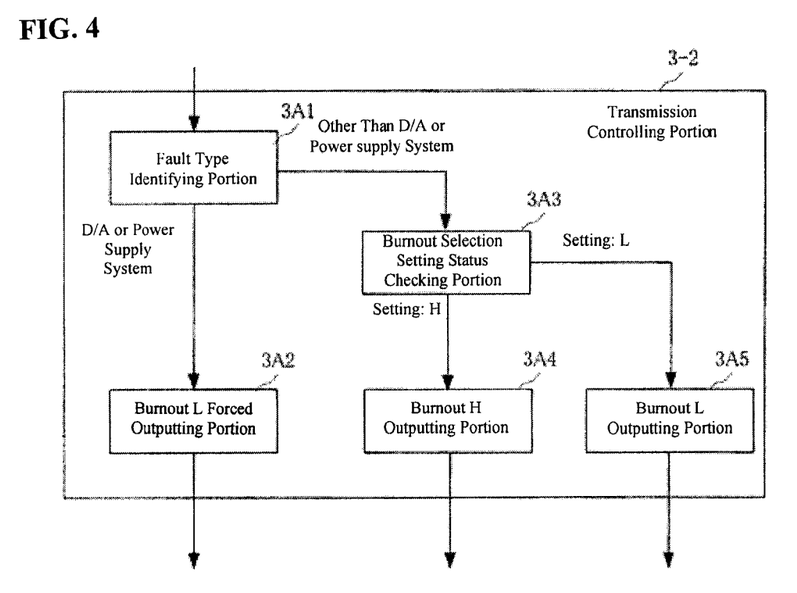
FIG. 4 is a functional block diagram of a transmission controlling portion used in the example of the process operation.

FIG. 4 illustrates a functional block diagram of the transmission controlling portion 3-2 in the case wherein the example of the process operation is applied. In this figure, 3A1 is a fault type identifying portion, 3A2 is a burnout L forced outputting portion, 3A3 is a burnout selection setting status checking portion, 3A4 is a burnout H outputting portion, and 3A5 is a burnout L outputting portion, wherein: the fault type identifying portion 3A1 performs a process operation in accordance with Step S202 in the flow chart; the burnout L forced outputting portion 3A2 performs a process operation in accordance with Step S203; the burnout selection setting status checking portion 3A3 performs a process operation in accordance with Step S204; the burnout H outputting portion 3A4 performs a process operation in accordance with Step S205; and the burnout L outputting portion 3A5 performs a process operation in accordance with Step S206.

Note that in the first example of the process operations, if a fault of a type wherein there is a probability that it will not be possible to output the burnout H signal and a fault of the type wherein there is a high probability that it will be possible to output the burnout H signal occur simultaneously, the fault of the type wherein there is the probability that it will not be possible to output the burnout H signal takes priority, and the burnout L signal is outputted.

Figure 5:
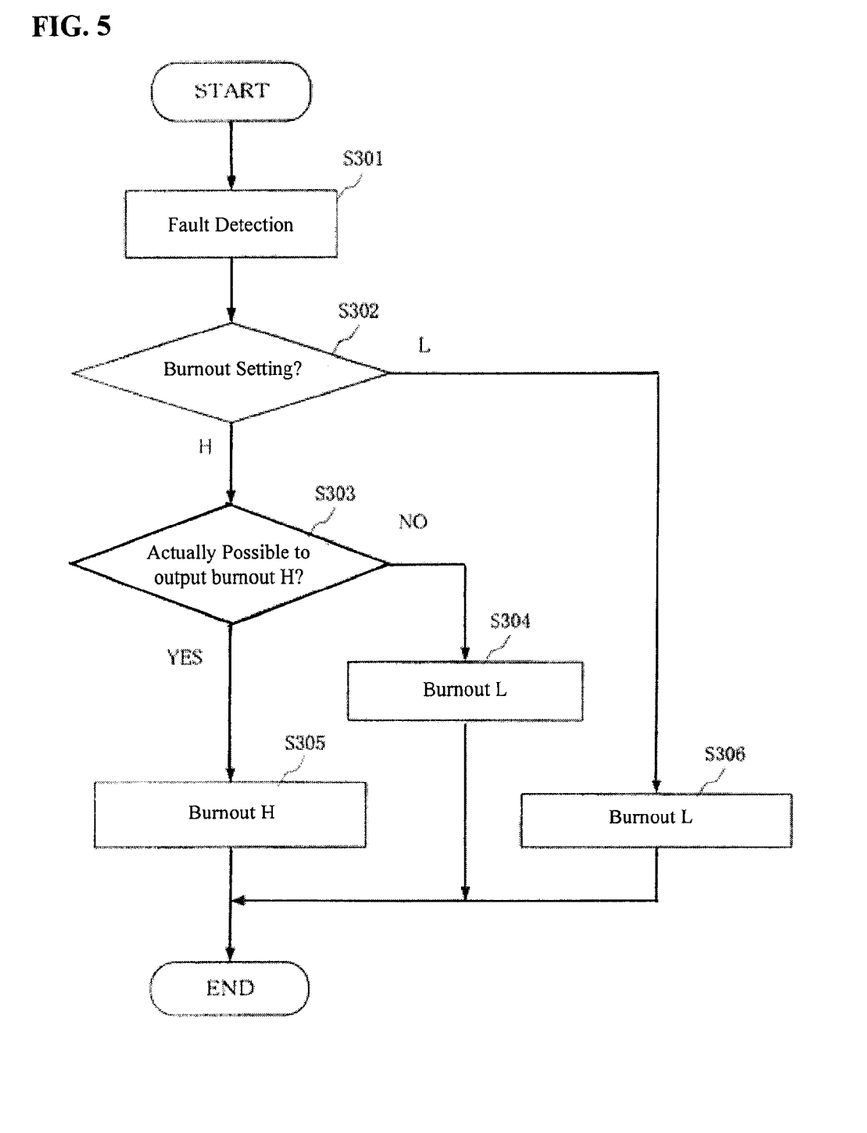
FIG. 5 is a flowchart illustrating a second example of a process operation of a transmission controlling portion in the field device.

Another Example of Process Operations: Example of Using the Burnout L Signal in a Case wherein it is Determined that the Burnout H Signal Actually Cannot be Outputted FIG. 5 illustrates another example of the process operations executed in the transmission controlling portion 3-2. In this second example of the process operations, when a fault is detected by the fault detecting portion 3-3 (Step S301), then the transmission controlling portion 3-2 checks the selection setting status for the burnout signal from the DIP switch 7 (Step S302). The process function in this Step S302 corresponds to the burnout signal selection setting status checking means in the invention as set forth.

If the selection setting status for the burnout signal from the DIP switch 7 is set to the burnout H signal, then a check is performed as to whether or not it is actually possible to output the burnout H signal (Step S303).

In this case, the check as to whether or not it is actually possible to output the burnout H signal is performed through disabling the output of signals to the transmission circuit L in the communications portion 5, applying an output instruction for the electric current value in accordance with the burnout H signal to the measured value calculating portion 3-1, and monitoring the output value of the D/A converting device 4 in accordance with the output instruction.

If, in Step S303, it is not actually possible to output the burnout H signal, then the transmission controlling portion 3-2 uses the burnout L signal as the signal to be outputted to the transmission circuit L in relation to that fault (Step S304). That is, an instruction is applied to the communications portion 5 to output the burnout L signal to the transmission circuit L. The processes in these steps S303 and S304 correspond to the burnout signal changing means in the invention as set forth.

If, in Step S303, it was actually possible to output the burnout H signal, then the transmission controlling portion 3-2 uses the burnout H signal as the signal to be outputted to the transmission circuit L, according to the selection setting status of the burnout signal from the DIP switch 7 (Step S305).

Note that in Step S302, if the setting selection status for the burnout signal from the DIP switch 7 was the burnout L signal, then the burnout L signal would be used immediately as the signal to be outputted to the transmission circuit L, according to that selection setting status (Step S306).

Figure 6:
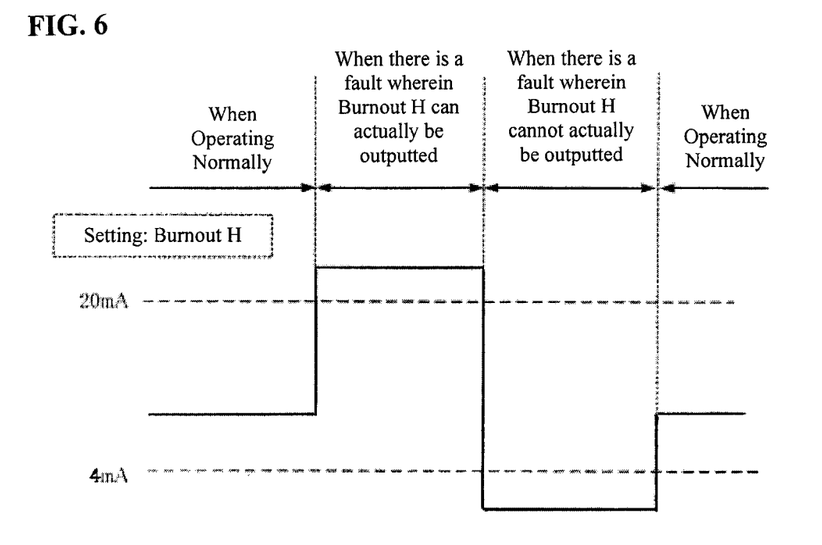
FIG. 6 is a timing chart illustrating the state of the burnout signal output when burnout H is set in another example of the process operation.

A timing chart for the output status of the burnout signal when burnout H is set in the second example of the process operation is illustrated in FIG. 6. As can be understood from this timing chart as well, when, in the second example of the process operations, a fault occurs wherein it is not actually possible to output the burnout H signal, the burnout L signal will be outputted reliably, increasing the reliability of the fault notification when burnout H is set.

In this example of the process operations, the checking as to whether or not the burnout H signal is actually outputted further increases the reliability of the fault notification through the burnout L signal being outputted instead, even when it is not possible to output the burnout H signal due to, for example, inadequate voltage.

Figure 7:
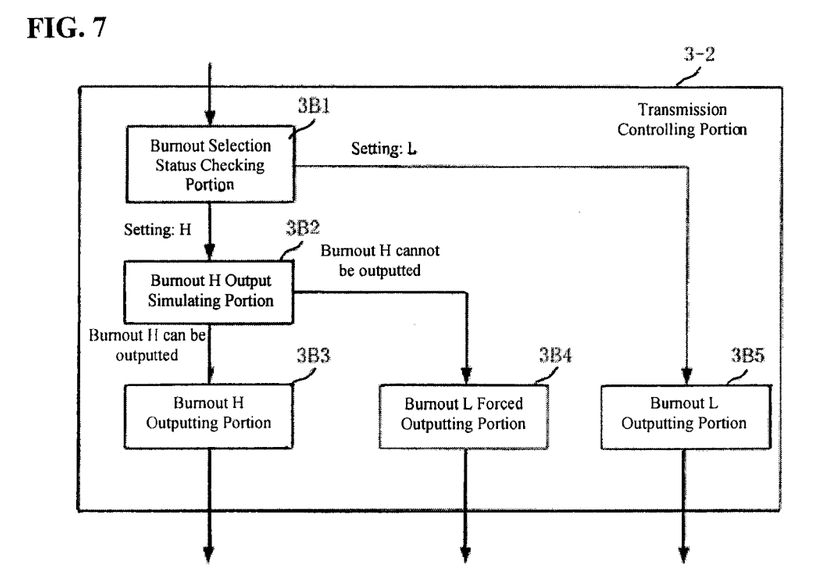
FIG. 7 is a functional block diagram of a transmission controlling portion used in the other example of the process operation.

FIG. 7 illustrates a functional block diagram of the transmission controlling portion 3-2 in the case wherein the example of the process operations is applied. In this figure, 3B1 is a burnout selection setting status checking portion, 3B2 is a burnout H output simulating portion, 3B3 is a burnout H outputting portion, 3B4 is a burnout L forced outputting portion, and 3B5 is a burnout L outputting portion; wherein: the burnout selection setting status checking portion 3B1 performs an operation process corresponding to Step S302 in the flow chart illustrated in FIG. 5; the burnout H output simulating portion 3B2 performs an operation process corresponding to Step S303; the burnout H outputting portion 3B3 performs a process operation corresponding to Step S302; the burnout L forced outputting portion 3B4 performs an operation process corresponding to Step S304; and the burnout L outputting portion 3B5 performs an operation process corresponding to Step S306.

Note that in this example of process operations, if there is a fault wherein it is not actually possible to output the burnout H signal and there is, at the same time, a fault wherein it is actually possible, then the fault wherein it is not actually possible to output the burnout H signal takes priority, and the burnout L signal is outputted.

While in Example above the explanation was for an example of a field device equipped with a DIP switch 7 that enables the selective setting of the burnout H signal and the burnout L signal, the distinctive technology in the present invention, explained in the example, can also be applied to a field device wherein the signal to be outputted to the transmission circuit when a fault is detected is only the burnout H signal.

Figure 8:
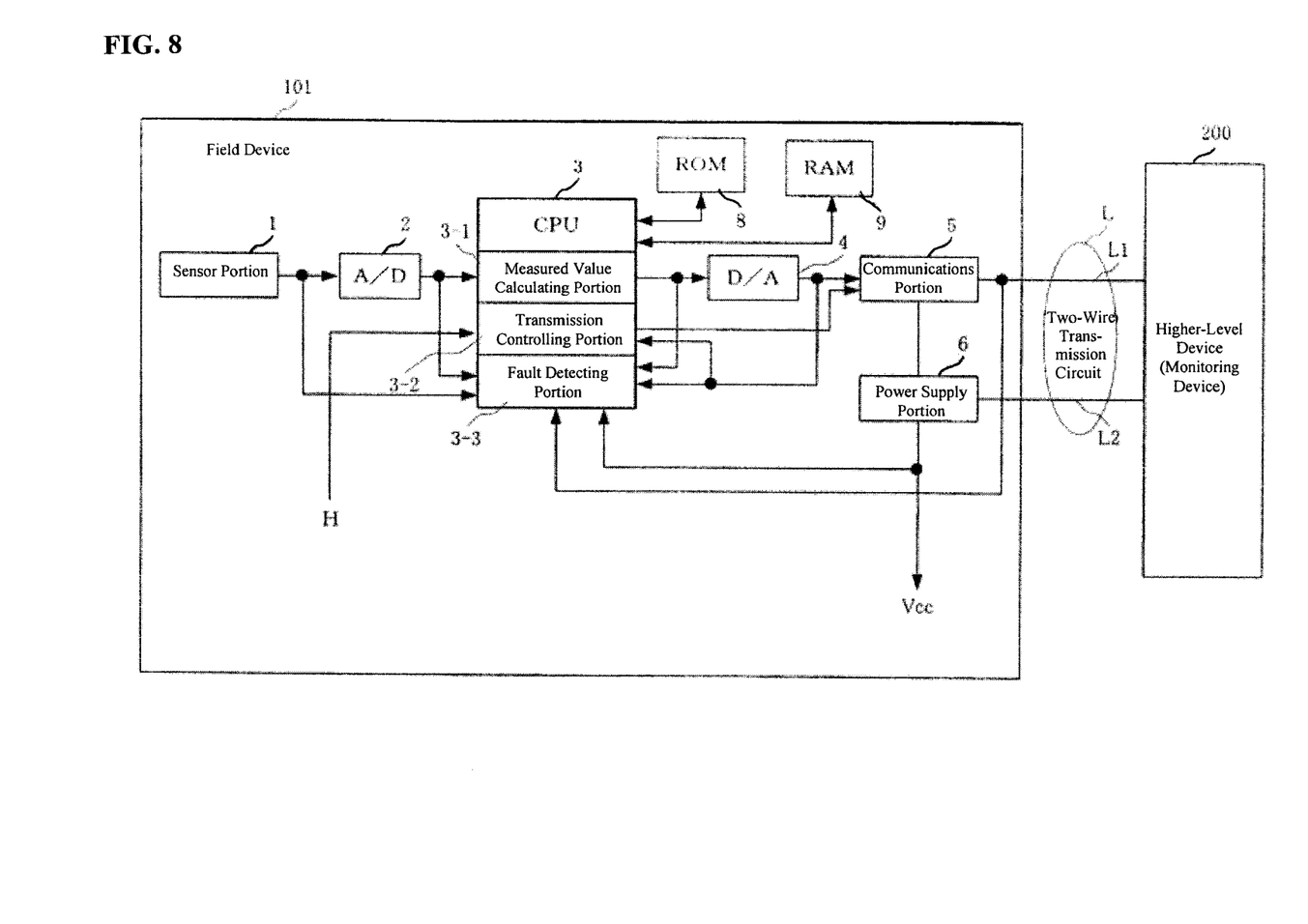
FIG. 8 is a block diagram illustrating schematically another example of a field device according to the present invention.

FIG. 8 shows the structure of a field device wherein the setting for the signal to be outputted to the transmission circuit when a fault is detected is only the burnout H signal. This field device 101 does not have the DIP switch 7 that is provided in the field device 100, but rather the burnout H signal is set statically in advance for the transmission controlling portion 3-2, as the signal to be outputted to the transmission circuit when a fault is detected.

Example of the Process Operations

Figure 9:
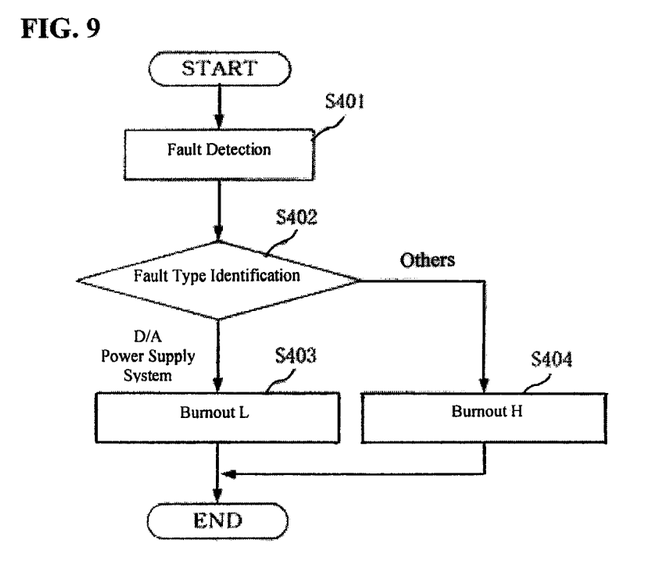
FIG. 9 is a flowchart illustrating a first example of a process operation of a transmission controlling portion in the field device.

A flowchart of a first example of the process operations that are executed by the transmission controlling portion 3-2 in this field device 101 is presented in FIG. 9. When, in this case, a fault is detected by the fault detecting portion 3-3 (Step S401), the transmission controlling portion 3-2 identifies the type of fault (Step S402). If the type of fault is a fault in the D/A converting device 4 and/or the power supply portion 6, then it is determined that there is a high probability that it is not possible to output the burnout H signal, and the burnout L signal is used as the signal to be outputted to the transmission circuit L for that fault (Step S403). If the type of fault is not a fault in the D/A converting device 4 or the power supply portion 6, then the burnout H signal is used as the signal to be outputted to the transmission circuit L (Step S404).

Figure 10:
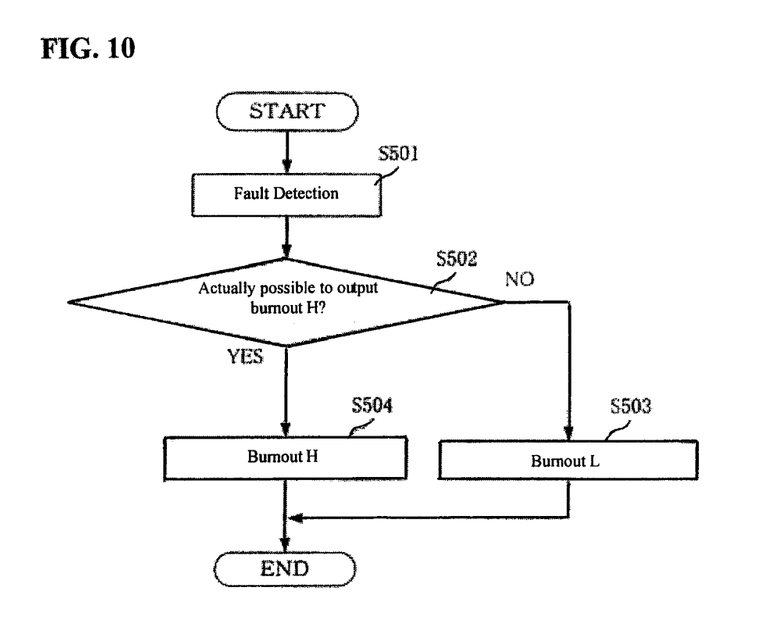
FIG. 10 is a flowchart illustrating a second example of a process operation of a transmission controlling portion in the field device.

A flowchart of a second example of the operation processes executed by the transmission controlling portion 3-2 in the field device 101 is presented in FIG. 10. When a fault is detected by the fault detecting portion 3-3 (Step S501) in this case, the transmission controlling portion 3-2 checks whether or not it is actually possible to output the burnout H signal (Step S502). If it is not actually possible to output the burnout H signal here, then the signal that is outputted to the transmission circuit L in regards to this fault will be the burnout L signal (Step S503). If it is possible to output the burnout H signal, then it is the burnout H signal that is outputted to the transmission circuit L (Step S504).

Note that while in the examples set forth above, the functions of the transmission controlling portion 3-2 and the fault detecting portion 3-3 were achieved as process functions by the CPU 3 following a program, a fault diagnosing circuit having process functions similar to those of the transmission controlling portion 3-2 and the fault detecting portion 3-3 may be equipped separately.

The field device according to the present invention can be used in a variety of fields, such as process control, as a field device wherein the value of the electric current that flows in a two-wire transmission circuit is regulated in accordance with a measured value.

The invention claimed is:

1. A field device comprising:
   electric current regulator regulating the value of an electric current that flows in a two-wire transmission circuit in accordance with a measured value, with a specific electric current range as a normal regulating range;
   fault detector detecting various types of faults that occur within the device itself;
   burnout direction setting device able to set whether to output to the transmission circuit a first burnout signal of a level higher than an upper limit value of the normal regulating level or to output to the transmission circuit a second burnout signal that is less than a lower limit value for the normal regulating range, when a fault has been detected by the fault detector;
   and burnout direction changing device evaluating whether or not it is possible to output the first burnout signal in relation to a fault that has been detected by the fault detector, and causing the signal that is outputted in response to the fault to be the second burnout signal if it is determined that it is not possible to output the first burnout signal.

2. A field device as set forth in claim 1, wherein:
   the burnout direction changing device comprises:
   fault type identifyer identifying, when a fault has been detected by the fault detectors, whether or not that fault is a fault of a type wherein there is a possibility that the first burnout signal cannot be outputted; and
   burnout signal changing device using the second burnout signal as the signal to be outputted for the fault when a fault of a type wherein there is a possibility that the first burnout signal cannot be outputted has been identified by the fault type identifyer.

3. A field device as set forth in claim 1, wherein:
   the burnout direction changing device comprises:
   burnout signal setting status checking device checking the setting status, by the burnout direction setting device, for the burnout signal when a fault has been detected by the fault detector; and
   burnout signal changing device checking, when it has been confirmed, by the burnout signal setting status checking means, that the setting status is that of outputting the first burnout signal, whether or not it is actually possible to output the first burnout signal, and for using the second burnout signal as the signal that is outputted for the fault if it was not actually possible to output the first burnout signal.

4. A field device as set forth in claim 1, set in advance statically to use the first burnout signal has the burnout signal to be outputted to the transmission circuit.

* * * * *